United States Patent [19]

Wipfelder et al.

[11] Patent Number: 5,837,771
[45] Date of Patent: Nov. 17, 1998

[54] FLAME RETARDANT REACTION RESIN SYSTEM

[75] Inventors: Ernst Wipfelder, Munich; Winfried Plundrich, Germering, both of Germany

[73] Assignee: Lemens Aktiengesellschaft, Munich, Germany

[21] Appl. No.: 583,778

[22] Filed: Jan. 11, 1996

[30] Foreign Application Priority Data

Jan. 10, 1995 [DE] Germany .......... 195 00 496.5
Feb. 17, 1995 [DE] Germany .......... 195 06 010.5

[51] Int. Cl.$^6$ ...................................... C08K 3/32
[52] U.S. Cl. .................. 524/786; 524/788; 524/789; 525/523; 525/528; 528/408; 528/409
[58] Field of Search ..................... 528/409, 408; 525/523, 528; 524/786, 789, 788

[56] References Cited

U.S. PATENT DOCUMENTS 5,262,456  11/1993  Wipfelder et al. .

FOREIGN PATENT DOCUMENTS 0 409 308 A2   1/1991   European Pat. Off. .
0 475 899 A1   3/1992   European Pat. Off. .
42 37 132 C1   7/1994   Germany .
43 08 185 A1   9/1994   Germany .

*Primary Examiner*—Catherine Timm
*Assistant Examiner*—Suzanne E. Mason
*Attorney, Agent, or Firm*—Hill & Simpson

[57] ABSTRACT

For improved flame retardant finishing and better processability of an epoxy anhydride reaction resin system, the present invention provides a reaction resin system supplemented with phosphinic and/or phosphonic acid anhydride as the hardener component. The phosphorus-containing anhydrides do not deteriorate the hardening characteristics. Molded members manufactured therefrom exhibit adequate flame retardant behavior even with slight proportions of phosphinic or phosphonic acid anhydride given a property profile that is otherwise unmodified.

12 Claims, No Drawings

FLAME RETARDANT REACTION RESIN SYSTEM

BACKGROUND OF THE INVENTION

The present invention relates to casting resins that exhibit flame retardant properties. More specifically, the present invention relates to casting resins suitable for the production of fire retardant covers for electrical and electronic devices.

Casting resins can be used to protect active and passive components by coating, embedding, or sealing the components with the casting resin. To protect the covered components, the hardened casting resin molding component should contain as few corrosion-stimulating components as possible. Additionally, in order to reduce the risk of fire, casting resins should be fire retardant. Flammability is always a concern during the operation of electrical and electronic devices.

Process-dependable flame retardant reaction resin molding materials are required for coating and encapsulating electrical and electronic components. Reaction resins that can be processed by casting are thereby standard, particularly given passive components. Epoxy resins are employed to a great extent for this purpose, these being thermally highly stressable and thereby exhibiting good mechanical and electrical properties. The low-molecular or oligomeric initial constituents can be converted into high-grade duroplastic materials upon employment of a variety of hardeners such as, for example, carbonic acid anhydrides, amines, phenols or isocyanate or by ionic polymerization. The low-molecular to oligomeric initial condition of the epoxy resins is responsible for the advantageous processing behavior of epoxy resins. They can be highly filled with inorganic, inert fillers and can then still be processed as casting resin.

The flame-retardant finishing of epoxy resin molding materials is currently implemented with halogen-containing and specific bromine-containing aromatic constituents. However, these embedded constituents, which frequently contain antimony trioxide as a synergist, present additional problems in case of fire. In the case of fire, such fire retarding agents release toxic, environmentally contaminately substances. Upon carbonization at low temperature, combustion, or corrosive and unfavorable conditions, ecologically and toxicologically harmful decomposition products are released. Considerable technical outlay must also be performed for non-hazardous waste disposal by incineration.

Phosphorus-containing additives for epoxy resins that improve the flame-retardant properties have been utilized. U.S. Pat. No. 5,262,456 proposes that a phosphinic or phosphonic acid derivative be bonded into an epoxy resin molding material with hydroxy alkyl groups. German Patent No. DE 42 37 132 proposes that phosphorus constituents based on employing phosphine oxide or phosphonate as the reaction resin constituent increases the flame-retardant properties. German Patent Application No. DE 43 08 185 A1 proposes that polyepoxide compounds be converted into phosphorus-containing epoxy compounds by conversion with a phosphone acid anhydride and that these then be crosslinked with known hardener components to form flame retardant molding materials.

A disadvantage of these phosphorus compounds, however, is their relatively low phosphorus content. As a consequence, substantial quantities of these phosphorus-containing compounds are required in order to obtain a satisfactory flame protection. Moreover, noticeable limitations in the processability of such modified reaction resin systems derive because of the high viscosity of these phosphorus constituents particularly observed in the phosphorus-modified epoxy resins. The phosphonic acid derivatives are in fact usually lower in viscosity and can thus be advantageously utilized for the casting technique. However, such phosphonic acid derivatives exhibit less of a flame retardant effect and must therefore be utilized in a higher concentration. This can in turn disadvantageously influence the molding material properties.

Therefore, a need exists for an improved reaction resin system exhibiting sufficient flame retardant properties suitable for covering electronic components that avoids the disadvantages of previous resin systems. The resulting molding material manufactured from the resin system should meet the required flame retardant specification for electronic components without the processability of the reaction resin system, the molding material properties or the dependability of a component covered or encapsulated with the molding material being thereby negatively influenced. Moreover, the improved resin system should produce a molding material that has no eco-toxicologically harmful decomposition products when burned.

SUMMARY OF THE INVENTION

The present invention provides a reaction resin system modified with phosphorus-containing anhydrides that avoids the disadvantages of prior reaction resin systems known for electronic components. The resulting resin systems have improved flame retardant finishing and better processability compared with prior resin systems. The inventors have surprisingly discovered that utilizing phosphinic acid anhydride and/or phosphonic acid anhydride in any ratio with other known constituents of a reaction resin system provides a surprisingly improved reaction resin system.

The reaction resin system of the present invention includes an epoxy constituent and a hardener constituent. Uniquely, the hardener constituent includes either a phosphonic acid anhydride having the following general formula:

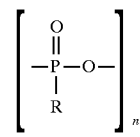

or a phosphinic acid anhydride having the following general formula:

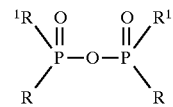

wherein R and $R^1$ is an alkyl or alkenyl radical with 1 to 40 carbon atoms independently of one another, a cycloaliphatic or an aryl radical and n is a whole number. Various mixtures of the anhydrides may also be utilized as well as mixtures of the phosphorus-containing anhydrides with carbonic acid anhydride.

In an embodiment, the hardener component is a solution of the phosphonic acid anhydride or the phosphinic acid anhydride in a di- or tetracarbonic acid anhydride that is liquid at least at the processing temperature of the reaction resin system.

In an embodiment, the carbonic acid anhydride utilized in the reaction resin system is an anhydride of an aromatic or cycloaliphatic di- or tetracarbonic acid.

In yet another embodiment, the reaction resin system further includes an additive commonly contained in epoxy resins. For example, the additional additive can be selected from: a reaction accelerator; a reactive diluent; a filler, a defoamer; an adhesion promoter; a thixotroping agent; a colorant; and a pigment.

The present invention also provides a method for manufacturing a flame retardant casting resin molding material. The method includes the step of mixing together an epoxy resin and a phosphorus-containing anhydride. The phosphorus-containing anhydride is either a phosphonic acid anhydride or a phosphinic acid anhydride. The various constituents are mixed together to form a reaction resin mixture. Then, the reaction resin mixture is cured at elevated temperature.

In an embodiment, the method further includes mixing a carbonic acid anhydride together with the epoxy resin and the phosphorous-containing anhydride.

Still further, the present invention provides a method for making a coated article. A shaped article is first provided in a casting mold. Then the casting mold is filled with a reaction resin mixture including an epoxy resin and a phosphorus-containing anhydride selected from either phosphonic acid anhydride or phosphinic acid anhydride. Then, the reaction resin mixture is cured at elevated temperatures.

In an embodiment, the reaction resin system further includes a carbonic acid anhydride.

The present invention also provides a method for enhancing the flame resistance of a molding material. The method includes incorporating certain phosphorus-containing anhydrides as a resin component in a reaction resin system on an epoxy basis. Suitable phosphorus-containing anhydrides are phosphonic acid anhydride and phosphinic acid anhydride.

Additional features and advantages of the present invention are described in, and will be apparent from, the detailed description of the presently preferred embodiments.

DETAILED DESCRIPTION OF THE PRESENTLY PREFERRED EMBODIMENTS

The present invention provides a reaction resin system with an improved hardening component. The invention is based on the surprising discovery that phosphonic acid anhydride and phosphinic acid anhydride can be mixed in any ratio with other known constituents of a reaction resin system. The anhydrides of the present invention can be added either directly to the reaction resin compound or mixed with standard, particularly liquid, carbonic acid anhydrides.

Table 1 shows the viscosity behavior with reference to the example of propane phosphonic acid anhydride (PPA) and PPA/hexahydrophthalic acid anhydride (HHPSA) mixture dependent on the temperature. The results set forth in the table demonstrate the advantages of the PPA/HHPSA mixture for casting resin applications. Specifically, Table 1 set forth characteristic values of a phosphorus-containing ("P-containing") anhydride and a P-containing anhydride mixture.

TABLE 1

| Component | P-containing Anhydride PPA | P-containing Anhydride mixture PPA/HHPSA (1:1) |
|---|---|---|
| Phosphorus content | 29% | 14.5% |
| Viscosity (mPas) at | | |
| 25° C. | high viscosity about | 2040 |
| 40° C. | 32000 | 680 |
| 60° C. | 6500 | 240 |
| 80° C. | 1500 | 120 |

Compared to a reaction resin system without the inventive phosphorus-containing anhydride, neither the hardening reaction nor the thermally mechanical molten material properties are negatively influenced with the present invention. Since such phosphorus-containing anhydrides, such as propane phosphonic acid anhydride (PPA), comprises a high phosphorus content of, for example, 29 weight percent, only minimal quantities of phosphorus-containing anhydrides are required in order to affect adequate flame protection. At the same time, the viscosity of the reaction resin system is only insignificantly increased as a result thereof, so that the processability thereof is not deteriorated.

The invention thus makes it possible to modify an arbitrary reaction resin system on an epoxy/anhydride basis in the direction of improved flame protection. The known reaction resin system can thereby comprise properties optimized for a specific employment that are not deteriorated by the inventive modification, namely addition of the phosphorus-containing anhydride.

Pursuant to the present invention, an adequately high flame resistance is achieved with a phosphorus content of the reaction resin system being from about 1 to 5 weight percent. The phosphorus-containing anhydrides exhibit a hardening characteristic comparable to carbonic acid anhydrides. The reactivity of such phosphorus-modified reaction resin systems can be designationally set by the addition of accelerators, as in the case of known phosphorus-free reaction resins systems.

Still further, the low viscosity of the reaction resin system that can be set with the present invention enables the use of a high filler constituent. In an embodiment, the filler constituent is present in an amount of up to 70 weight percent.

In one embodiment of the invention, alkane phosphonic acid anhydride is dissolved in a carbonic acid anhydride. For example, a suitable carbonic acid anhydride is the anhydride of a di- or tetracarbonic acid. This mixture yields a storable hardener component that can be stored for at least one year upon exclusion of moisture without significant changes of its properties.

A variety of carbonic acid anhydrides may be used pursuant to the present invention. Especially suitable carbonic acid anhydrides are the anhydrides of aromatic or cycloaliphatic di-, tetra- or polycarbonic acids. Carbonic acid anhydrides that are liquid at room temperature are preferred. Solid carbonic acid anhydrides, however, are also suitable.

Notably, it is not only the phosphorus content that is of significance for the flame-retardant properties of the inventive reaction resin system or of the molding material manufactured therefrom but also the carbonic acid anhydride. Further improvements in flame retardancy are achieved when the anhydride is derived from aromatic di- or tetra-carbonic acid. The aromatic framework structure of the carbonic acid can thereby be a one-nucleus or multi-nucleus aromatic. Phthalic acid anhydride represents the simplest species of this group of compounds.

Further examples of suitable aromatic anhydrides are benzol-1,2,4,5-tetracarbonic acid dianhydride, benzophenonetetracarbonic acid dianhydride or perylene-3,4,9,10-tetracarbonic acid-3,4,9,10-dianhydride, naphthalene-1,8-dicarbonic acid anhydride, benzoic acid anhydride or biphenyltetracarbon acid dianhydride.

In addition to the aromatic anhydrides, cycloaliphatic, aliphatic or olefinic anhydrides can also be utilized, such as hexahydrophthalic acid anhydride, methylhexahydrophthalic acid anhydride, succinic acid anhydride, valeric acid anhydride, isovaleric acid anhydride, hexane acid anhydride, pivalic acid anhydride, 5-norbornene-2,3 dicarbonic acid anhydride, maleic acid anhydride, 2-dodecenyl-1-succinic acid anhydride and methyltetrahydrophthalic acid anhydride.

Similar to the carbonic acid anhydride, a variety of epoxy resins may be utilized pursuant to the present invention. For example, a commercially obtainable epoxy resin or a mixture of commercially obtainable epoxy resins can be selected as the epoxy resin component. The polyglycidylethers on the basis of bisphenol-A and bisphenol-F have proven especially advantageous. In addition to the especially suitable aromatic polyglycidylethers, those of aliphatic alcohols are also suitable. Suitable examples of multi-valiant alcohols are 1,4-butanediol, 1,6-hexanediol, polyalkyleneglycols, glycerin, trimethylolpropane, bis-(4-hydroxycyclohexyl)-2,2-propane and pentaerythritol.

Polyglycidylesters are also suitable, these being obtained by conversion of, for example, epichlorohydrin or similar epoxy compounds with aliphatic, cycloaliphatic or aromatic polycarbonic acids. Those polyepoxides that are obtained by epoxification of polyalkenes are also suitable for the epoxy component.

Since the invention is directed to the modification of a traditional epoxy/anhydride reaction resin system, additional additives can also be contained in the inventive reaction resin system of the present invention. These are known additives for epoxy resins that influence the workability, the color or the properties of the hardened molding material. These additives can be selected dependent on the desired application. Such additives can be: reaction accelerators, reactive diluents, flow improvers, defoamers, adhesion promoters, thixotroping agents, colorants, pigments and fillers.

In addition to an improvement of the thermal-mechanical properties, fillers can additionally enhance the flame retardancy. Although this is already achieved with a high filler content and, thus, a reduction of the proportion of the organic resin matrix, the flame resistance can be improved as well by the selection of the filler. A filler having a flame retardancy effect that is highly compatible with the inventive reaction system is, for example, aluminum hydroxide. Slight amounts of aluminum hydroxide thereby already effect a substantial enhancement of the flame resistance. The low viscosity of the organic constituents that can be set enables filling degrees of up to 70 weight percent with known fillers, such as quartz powder, chalk and aluminum oxide.

Uniquely, in the reaction resin system of the present invention, the phosphorus-containing anhydrides behave like the carbonic acid anhydride hardeners standard in epoxy resin chemistry. A reaction resin system with exactly stoichiometric ratio of the constituents therefore contains the same number of epoxy equivalents as the sum of equivalents of carbonic acid anhydride and phosphorus-containing anhydride.

The processing of the reaction resin system preferably ensues in a casting resin application that is enabled by the low viscosity of the reaction resin system. Possible casting resin applications are, for example, the production of solid molded bodies by casting and hardening the reaction resin system in a casting mold, encapsulating active and passive electrical and electronic components, for example likewise by casting in a casting mold. Further casting resin applications are coatings and coverings that are produced by superficial application of the inventive reaction resin system.

The processing or the casting of the inventive reaction resin system can ensue at the temperatures standard in casting technology. Processing temperatures <130° C., however, are preferably selected in order to suppress a premature hardening of the reaction resin system in the application means. Whereas, a higher processing temperature serves the purpose of reducing the viscosity of the reaction resin system, a lower processing temperature can be advantageous for more reactive or more quickly hardening reaction resin systems.

The reactivity of the reaction resin system and, thus, the conditions allowed for processing or required for hardening can be set on the basis of a suitable selection of the reaction resin constituents. The hardening can be accelerated or enabled at lower temperatures with the assistance of reaction accelerators, for example the imidazoles standard in epoxy resins. The inventors have also discovered that the behavior and further properties of the reaction resin system are practically not influenced by the addition of the alkane phosphonic acid anhydride.

The resulting molding materials made pursuant to the present invention meet industry flame retardant standards. The molding materials obtained by hardening the reaction resin system meet the flame retardant standard UL 94 VO of Underwriters Laboratories up to a specimen thickness of 0.8 mm in an exemplary embodiment having 3% phosphorus content (with reference to the organic matrix) and 20% filler (aluminum hydroxide). Another exemplary embodiment has a UL 94 VO classification given a 3.2 mm specimen thickness with a phosphorus content of 1% and 20% aluminum hydroxide and 40% quartz powder. Over and above this, the molding materials manufactured from the reaction resin systems exert mechanical, thermal, electrical and chemical property values comparable to those of phosphorus-free epoxy-anhydride molding materials even given a phosphorus content of, for example, 3% by weight.

The inventive reaction resin system is very advantageously employed for casting out high-voltage component parts. For example, the present invention can be utilized to make support insulators for use in high-voltage transmission. What are thereby involved are insulator component parts having high electrical strength that mechanically fix the current-carrying system components electrically insulated relative to grounded potential. The quantities of casting resin required for this purpose vary between a few 100 g and several kg dependent on the component size. The casting resin is thereby separately prepared as resin and as hardener component. Subsequently, the two components are united and are homogenized at moderate temperature (90° through 100° C.) in a vacuum. The casting of the supporting insulators can then be implemented given adapted mold temperature and mass temperature according to the vacuum-casting technology or according to a pressure-gelling process for high-grade components. The supporters are usually removed from the mold hot after an incipient hardening phase and are cured over several hours at temperatures of approximately 140° C.

A supporter type manufactured with the inventive reaction resin system and having the dimensions of approximately 30 cm in height and approximately 10 cm in diameter has cantilever strength values between 8.6 and 8.9 kN and survives ten minutes exposure to flame intact. This resulting product thus meets the required quality standard.

By way of example, and not limitation, examples of the present invention will now be given.

EXAMPLE 1

For producing a P-containing formulated carbonic acid anhydride composed of propane phosphonic acid anhydride (PPA) and hexahydrophthalic acid anhydride (HHPSA), 104.0 mass parts of a 50-percent PPA solution (corresponds to 0.49 mol PPA in the example) are weighed into a vessel upon exclusion of moisture. After the quantitative removal of the solvent ethylacetate in a vacuum at 60° through 80° C., 52.0 mass parts (0.34 mol in the example) of hexahydrophthalic acid anhydride pre-heated to approximately 60° C. are added.

Due to the low viscosity, this phosphorus-containing anhydride mixture can be very easily processed. It comprises a viscosity of only 120 mPas at 80° C. and a phosphorus content of 14.5%. Moreover, storeability of at least one year at room temperature is established upon exclusion of moisture.

EXAMPLE 2

100.0 mass parts epoxyphenolnovolak (DEN 438), 36.0 mass parts of the P-containing anhydride mixture produced in Example 1, 39.3 mass parts hexahydrophthalic acid anhydride, 1.0 mass parts accelerator 1-cyanoethyl-2-phenylimidazole (2 PZ-CN) are mixed with 42.8 mass parts aluminum hydroxide filler (Apyral 4) at 60° C. The resin mixture is then degassed and hardened for 4 hours at 130° C.

Correspondingly produced standard rods that have a phosphorus content of 3% and a filler content of 20% meet the flame retardant standard UL 94 VO of Underwriters Laboratories up to a specimen thickness of 0.8 mm.

EXAMPLE 3

23.9 mass parts of a bisphenol-A-diglycidylether (MY 740) are processed with 1.4 mass parts solvent-free propane phosphonic acid anhydride, 14.4 mass parts phthalic acid anhydride, 20.0 mass parts aluminum hydroxide (Apyral 4) and 40.0 mass parts quartz powder (Silbnd FW EST 61) at 130° C. 0.24 mass parts of dimethylbenzylamine accelerator are added after the melting and mixing.

With a filler content of 60 weight percent, the highly filled casting resin exhibits a phosphorus content of only 1% and, after producing corresponding standard rods, yields high mechanical molding material properties given a hardening of 3 hours at 150° C. It meets the flame retardant specification of UL 94 VL up to a specimen thickness of 3.2 mm.

EXAMPLE 4

100.00 mass parts bisphenol-A-diglycidylether (MY740) were mixed with 29.0 mass parts ethylmethylphosphonic acid anhydride (corresponds to 0.15 mol), 49.6 mass parts hexahydrophthalic acid anhydride and 0.5 mass parts 1-cyanoethyl-2-phenylimidazole at 60° C.

Then, the low-viscosity epoxy casting resin compound is degassed before being filled into a appropriate casting mold and is subsequently hardened for 1 hour at 100° C. and 2 hours at 150° C.

The standard rod, which have a phosphorus content of 5%, manufactured therefrom yields a flame retardant specification of UL 94 VO up to a specimen thickness of 3.2 mm.

EXAMPLE 5

For casting out support insulators with the inventive reaction resin system, the casting resin is first prepared as a resin and hardener component.

For manufacturing the resin component, 813.0 mass parts of a low-molecular bisphenol-A-diglycidylether (Araldit F), 207.0 mass parts of a higher-molecular bisphenol-A-diglycidylether (Araldit B 44), 1971.0 mass parts filler composed of 1371.0 mass parts quartz powder (Christ quartz powder 2500) and 600.0 mass parts aluminum hydroxide (Apyral 2), and 9.0 mass parts colorant (iron oxide) are mixed in a heated kettle (approximately 90° C.).

The hardener component is likewise prepared in a heated kettle (temperature approximately 90° C.). It is composed of 573.0 mass parts hexahydrophthalic acid anhydride (HT 907), 6.0 mass parts accelerator dimethylbenzylamine (Desmorapid DB), 843.0 mass parts quartz powder (Christ quartz powder 2500), 369.0 mass parts aluminum hydroxide (Apyral 2) and 57.0 mass parts solvent-free propane phosphonic acid anhydride.

After the uniting of the resin and hardener components, the casting resin, which contains 0.34 weight percent phosphorus, 20 weight percent aluminum hydroxide and 45.6 weight percent quartz powder and which has a viscosity of about 4000 mPas at 90° C., is filled into a prepared casting mold, is pre-hardened for 3 hours at 120° C. and is subsequently unmolded hot. The cast support insulator that weighs about 3.5 kg is after-hardened for 6 hours at 140° C.

A support insulator equipped with the phosphorus-modified casting resin molding material is qualified for use in high-voltage transmission systems. It particularly meets the demands in view of halogen-free flame retardancy, creep resistance and cantilever strength.

It should be understood that various changes and modifications to the presently preferred embodiments described herein will be apparent to those skilled in the art. Such changes and modifications can be made without departing from the spirit and scope of the present invention and without diminishing its attended advantages. Therefore, the appended claims are intended to cover such changes and modifications.

We claim:

1. A reaction resin system comprising an unreacted admixture of:

an epoxy resin component, and a hardener component comprising a solution of a phosphonic acid anhydride in a di- or tetracarbonic acid anhydride that is liquid at least at a processing temperature of the reaction resin system, the phosphonic acid anhydride having the following general formula:

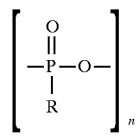

wherein:
R is an alkyl or alkenyl radical having 1 to 40 carbon atoms independently of one another, a cycloaliphatic or an aryl radical; and n is a whole number, and
wherein upon exclusion of moisture the unreacted admixture remains unreacted during storage.

2. A reaction resin system comprising an unreacted admixture of:
an epoxy resin component, and
a hardener component comprising a solution of a phosphinic acid anhydride in a di- or tetracarbonic acid anhydride that is liquid at least at a processing temperature of the reaction resin system, the phosphinic acid anhydride having the following general formula:

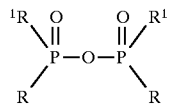

wherein:
R and $R^1$ is an alkyl or alkenyl radical having 1 to 40 carbon atoms independently of one another, a cycloaliphatic or an aryl radical; and n is a whole number, and
wherein upon exclusion of moisture the unreacted admixture remains unreacted during storage.

3. The reaction resin system of claim 1 wherein the carbonic acid anhydride is an anhydride of an aromatic or cycloaliphatic di- or tetracarbonic acid.

4. The reaction resin system of claim 1 further comprising an additional additive selected from the group consisting of: a reaction accelerator; a reactive diluent; a filler; a flow promoter; an adhesion promoter; a thixotroping agent; a colorant; and a pigment.

5. The reaction resin system of claim 2 wherein the carbonic acid anhydride is an anhydride of an aromatic or a cycloaliphatic di- or tetracarbonic acid.

6. The reaction resin system of claim 2 further comprising an additive selected from the group consisting of: a reaction accelerator; a reactive diluent; a filler; a flow promoter; an adhesion promoter; a thixotroping agent; a colorant; and a pigment.

7. The reaction resin system of claim 1 wherein the reaction resin system has a phosphorous content of from about 1 to 5 weight percent.

8. The reaction resin system of claim 2 wherein the reaction resin system has a phosphorous content of from about 1 to 5 weight percent.

9. The reaction resin system of claim 1 further comprising a filler present in the reaction resin system in an amount of up to 70 weight percent.

10. The reaction resin system of claim 2 further comprising a filler present in the reaction resin system in an amount of up to 70 weight percent.

11. The reaction resin system of claim 1 further comprising a filler selected from the group consisting of: aluminum hydroxide; quartz powder; chalk and aluminum oxide.

12. The reaction resin system of claim 2 further comprising a filler selected from the group consisting of: aluminum hydroxide; quartz powder; chalk and aluminum oxide.

* * * * *

UNITED STATES PATENT AND TRADEMARK OFFICE
CERTIFICATE OF CORRECTION

PATENT NO.   :   5,837,771
DATED        :   November 17, 1998
INVENTOR(S)  :   Ernst Wipfelder and Winfried Plundrich It is certified that error appears in the above-identified patent and that said Letters Patent is hereby corrected as shown below:

(73)    Assignee should read:

Siemens Aktiengesellschaft not

Lemens Aktiengesellschaft

Signed and Sealed this

Twentieth Day of April, 1999

Attest:

Q. TODD DICKINSON

*Attesting Officer*   *Acting Commissioner of Patents and Trademarks*